United States Patent
Bothra et al.

(10) Patent No.: US 6,176,983 B1
(45) Date of Patent: *Jan. 23, 2001

(54) METHODS OF FORMING A SEMICONDUCTOR DEVICE

(75) Inventors: Subhas Bothra, San Jose; Dipankar Pramanik, Saratoga; Samit Sengupta, San Jose, all of CA (US)

(73) Assignee: VLSI Technology, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/923,384

(22) Filed: Sep. 3, 1997

(51) Int. Cl.[7] .................................................. C23C 14/34
(52) U.S. Cl. ............................. 204/192.17; 204/192.25; 204/192.3; 204/192.32; 204/298.35; 204/298.23
(58) Field of Search ..................... 204/192.17, 192.25, 204/192.32, 192.3, 298.31, 298.35, 298.25, 298.26, 298.23

(56) References Cited

U.S. PATENT DOCUMENTS

| | | | |
|---|---|---|---|
| 4,999,096 | * 3/1991 | Nihei et al. | 204/192.3 |
| 5,019,234 | * 5/1991 | Harper | 204/192.17 |
| 5,089,442 | * 2/1992 | Olmer | 204/192.3 |
| 5,108,570 | * 4/1992 | Wang | 204/192.3 |
| 5,171,412 | * 12/1992 | Talieh et al. | 204/192.17 |
| 5,338,423 | * 8/1994 | Hindman et al. | 204/192.12 |
| 5,429,729 | * 7/1995 | Kamei et al. | 204/192.12 |
| 5,639,357 | * 6/1997 | Xu | 204/192.3 |
| 5,780,357 | * 7/1998 | Xu et al. | 204/192.17 |
| 5,783,282 | * 7/1998 | Leiphart | 204/192.17 |

OTHER PUBLICATIONS

Bothra, S. and S. Sengupta, "Extending PVD TiN to Sub–0.25μm Technologies Using Ionized Metal Plasmas," VMIC Conference, Jun. 10–12, 1997.

Rossnagel, S. and J. Hopwood, "Metal ion deposition from ionized mangetron [sic] sputtering discharge," J. Vac. Sci, Technol. B 12(1), Jan./Feb. 1994.

Wang, Shi–Qing, et al., "Step coverage comparison of Ti/TiN deposited by collimated and uncollimated physical vapor deposition techniques," J. Vac. Sci. Technol. B 14(3), May/Jun. 1996.

* cited by examiner

*Primary Examiner*—Maria Nuzzolillo
*Assistant Examiner*—Julian A. Mercado
(74) *Attorney, Agent, or Firm*—Wells, St. John, Roberts, Gregory & Matkin, P.S.

(57) ABSTRACT

The present invention provides methods of forming a semiconductor workpiece. One method of forming a semiconductor device in accordance with the present invention includes: providing a semiconductor workpiece; forming a via within the semiconductor workpiece, the via including plural sidewalls joining a bottom surface at respective plural corners; first sputtering a process layer upon at least a portion of the bottom surface using ionized metal plasma physical vapor deposition; and following the sputtering of the process layer, second sputtering at least some of the process layer towards the corners within the via.

24 Claims, 3 Drawing Sheets

METHODS OF FORMING A SEMICONDUCTOR DEVICE

TECHNICAL FIELD

The present invention relates to methods of forming a semiconductor device.

BACKGROUND OF THE INVENTION

Advanced interconnect systems currently require extensive use of liners, glue layers and barrier layers. Titanium (Ti) and titanium nitride (TiN) thin films are used for providing such layers to facilitate the integration of tungsten (W) and aluminum (Al) filled plugs for contacts and vias. Plug aspect ratios of 2:1–3:1 will be needed for 0.25 and 0.18 micron CMOS logic technologies at sub 0.4 micron and 0.3 micron diameters, respectively. At these geometries, the demands on the step coverage of these films is increased considerably. At and beyond 0.25 micron technology, conventional Physical Vapor Deposition (PVD) of TiN is limited by step coverage. Several alternative processes to address these issues have been investigated, leading to considerable advances in Chemical Vapor Deposition (CVD) of TiN and collimated sputtering of TiN. Chemical Vapor Deposition of TiN can provide excellent step coverage. However, typically these processes require relatively high deposition temperatures and impurities such as carbon or halides from the precursors are often incorporated in the film.

In current CMOS processes, Ti and TiN films are deposited by Physical Vapor Deposition (PVD) using magnetron sputtering. The use of PVD provides excellent film properties at high purities and low defect densities. Thus, it is preferable and cost-effective to extend the capabilities of PVD processes as far as possible.

In the case of Ti films, this has been previously achieved by collimated PVD. However, the collimator approach for TiN has not been as successful due to defect problems. In particular, the TiN film deposited on the collimator surfaces does not adhere well to the surfaces and is a source for particle generation. A further disadvantage of the collimator approach is a reduced and variable deposition rate during the collimator life due to deposition of the film on the collimator.

PVD TiN is widely used for liner and glue layer applications in production of 0.35 micron generation products. Standard PVD TiN, however, does not have adequate bottom coverage, limiting its use beyond 0.25 micron technology. Once an overhang adjacent a via becomes appreciable, it further shadows the deposition on the sidewalls and bottom corners. Thus, simply using thicker deposited film cannot get around this problem. Thicker TiN also introduces several other problems—(i) the overhang at the via top makes W via fill more difficult; (ii) the thinning of the TiN just below the overhang creates a potential weak spot; and (iii) the thicker TiN dimensions over the field leads to a thicker metal stack height.

In previous technologies, the via profile was sloped slightly to accommodate the TiN overhang. This approach cannot be extended as design rules shrink and via to adjacent metal spacing becomes very small (i.e., ~0.3 micron). The space of 0.3 micron has to accommodate overlay misalignment and the critical dimension variation in the via and metal patterns. Such requires via profiles to be vertical. The second problem listed above can lead to catastrophic failures. Here, the barrier TiN layer may fail just below the overhang, leading to a reaction between Ti and $WF_6$ during CVD W deposition.

The W material deposited on the field area is normally removed by either CMP or by plasma etch. In the case where CMP is used, the use of thicker TiN requires a longer CMP polish step thereby reducing throughput. In the case where plasma W etch is used, the thicker TiN also results in a thicker metal stack for the next metal layer. A thicker metal stack makes it more difficult to achieve adequate gap fill at minimum spaces. More importantly, it results in increased sidewall capacitance. Such increased capacitance degrades the interconnect performance—both in terms of interconnect speed and crosstalk.

Referring to conventional sputtering deposition technologies, neutral metal atoms are emitted from the target in a roughly cosine distribution. This distribution coupled with the optimization of the sputtered source area is designed to result in a uniform thin film deposition on the substrate. This coupled with some gas scattering results in the metal atoms arriving at the substrate at a large angular distribution. This angular range manifests itself in varying deposition rate and film thickness uniformity dependent on the target to substrate spacing. It is also the primary reason for poor step coverage inasmuch as the field area has a large solid angle of view of the target, while the via sidewall and bottom have only a limited view.

Therefore, Ion Metal Plasma Physical Vapor Deposition (IMP PVD) has been utilized to improve bottom coverage of vias compared with conventional sputtering techniques. For example, in conventional sputtering techniques, the thickness of the material deposited at the base or bottom surface of the contact is typically 10% of the thickness of the material deposited atop horizontal surfaces outside of the contact area. However, with the utilization of IMP PVD, the thickness of the material deposited at the base or bottom surface of the contact is typically 30–40% of the thickness of the material deposited atop horizontal surfaces outside of the via or contact area.

A significant percentage of the neutral atoms emitted by the source are ionized by a radio frequency (RF) plasma generated between the source and the substrate in IMP PVD. These metal ions arrive at the semiconductor workpiece or wafer at a normal incidence resulting in substantial improvement in the bottom coverage of the via opening. The sidewall coverage is significantly reduced due to the arrival of the metal ions at a normal incidence.

It has been observed that IMP PVD of TiN typically provides sufficient bottom coverage in the center of the bottom surface of the via. However, the coverage at corners defined by the bottom surface and the sidewalls of the via is relatively thin compared with the coverage at the center region of the bottom surface of the via.

Therefore, there exists a need to provide adequate layer coverage adjacent the corners defined by the sidewalls and bottom surface of the via formed within the semiconductor device.

BRIEF DESCRIPTION OF THE DRAWINGS

Preferred embodiments of the invention are described below with reference to the following accompanying drawings.

DETAILED DESCRIPTION OF THE
PREFERRED EMBODIMENTS

This disclosure of the invention is submitted in furtherance of the constitutional purposes of the U.S. Patent Laws "to promote the progress of science and useful arts" (Article 1, Section 8).

According to one aspect of the present invention, methods of forming a semiconductor device comprise: providing a semiconductor workpiece; forming a process layer upon a first area of the semiconductor workpiece; and following the forming of the process layer, distributing at least a portion of the process layer to a second area of the semiconductor workpiece.

A second aspect of the present invention discloses methods of forming a semiconductor device comprising: providing a semiconductor workpiece; forming a via within the semiconductor workpiece, the via including plural sidewalls joining a bottom surface at respective plural corners; providing a process layer upon at least a portion of the bottom surface of the via; and following the providing of the process layer, distributing at least some of the process layer towards the corners within the via.

Another aspect of the invention provides methods of forming a semiconductor device comprising: providing a semiconductor workpiece; sputtering a process layer upon at least a portion of the semiconductor workpiece using ionized metal plasma physical vapor deposition; and following the sputtering of the process layer, distributing at least some of the process layer.

A fourth aspect of the present invention provides methods of forming a semiconductor device comprising: providing a semiconductor workpiece; providing a process layer upon at least a portion of the semiconductor workpiece; and following the formation of the process layer, sputtering at least some of the process layer.

Yet another aspect of the present invention provides methods of forming a semiconductor device comprising: providing a semiconductor workpiece; forming a via within the semiconductor workpiece, the via including plural sidewalls joining a bottom surface at respective plural corners; first sputtering a process layer upon at least a portion of the bottom surface using ionized metal plasma physical vapor deposition; and following the sputtering of the process layer, second sputtering at least some of the process layer towards the corners within the via.

Figure 1:
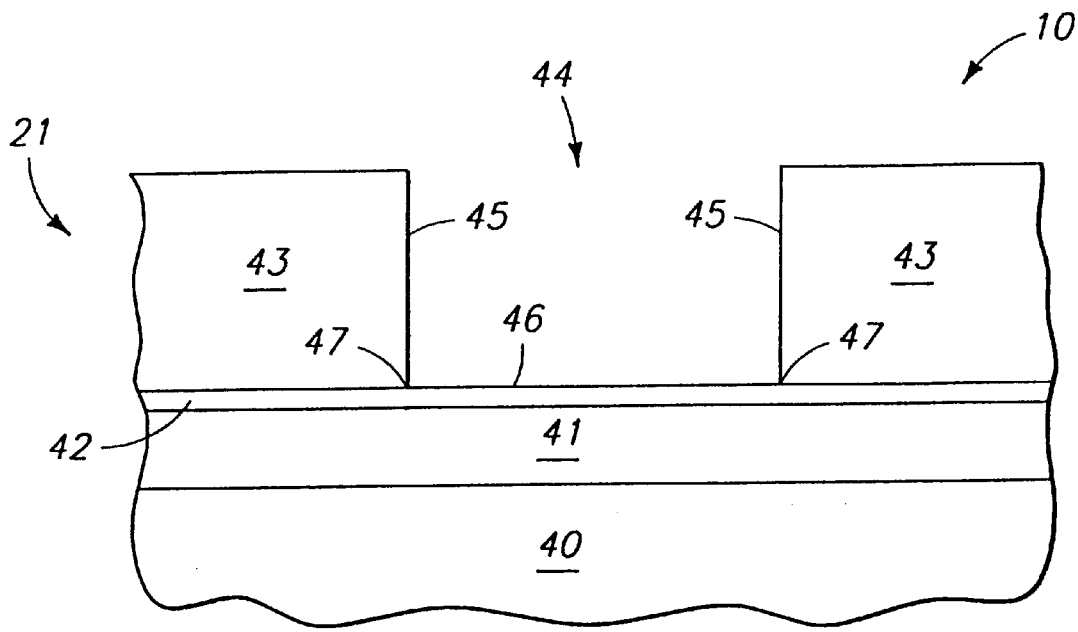
FIG. 1 is a cross-sectional view of a via formed within a semiconductor workpiece.

Referring to FIG. 1, a portion of a sub-quarter micron semiconductor device 10 of a semiconductor workpiece 21 is shown in detail. The methods of the present invention may also be utilized to form devices having CMOS logic technologies in excess of 0.25 micron. Semiconductor workpiece 21 comprises a substrate 40, such as silicon, and metallization 41, such as aluminum, formed upon an upper surface of substrate 40.

An optional antireflective coating 42 is formed upon the aluminum metallization 41 in one embodiment of the invention. Antireflective coating 42 comprises titanium nitride (TiN) in the described embodiment. Alternatively, antireflective coating 42 comprises titanium tungsten (TiW), tantalum (Ta), tantalum nitride (TaN), or other suitable materials.

Antireflective coating 42 is sputtered onto the surface of the semiconductor wafer or workpiece 21 before the resist. The provision of antireflective coating 42 can aid the patterning of small images. The antireflective coating 42 layer brings several advantages to the masking process. The first advantage is a planarizing of the surface which provides for a more planarized resist layer. Second, antireflective coating 42 cuts down on light scattering from the surface into the resist which aids in the definition of small images. Antireflective coating 42 can also minimize standing wave effects and improve the image contrast. The latter benefit comes from increased exposure latitude with a proper antireflective coating 42.

After the resist is spun on top of the antireflective coating 42, the workpiece 21 is aligned and exposed. The pattern is developed in the resist. During etching of the semiconductor workpiece 21, antireflective coating 42 may act as an etch barrier. Antireflective coating 42 also preferably has good adhesion properties with the wafer or workpiece surface and the resist.

An insulative layer 43, such as silicon dioxide, is next formed over metallization 41 and antireflective coating 42. Insulative layer 43 is deposited upon semiconductor workpiece 21.

A via 44 having plural sidewalls 45 and a bottom surface 46 is subsequently patterned within the silicon dioxide insulative layer 43. Sidewalls 45 extend from bottom surface 46 of via 44. Via 44 is patterned by conventional techniques exposing the metallization 41 or antireflective coating 42 below the insulative layer 43. Alternatively, via 44 extends to substrate 40 in embodiments wherein metallization 41 and antireflective coating 42 are not provided below the insulative layer 43. Plural corners 47 are defined by bottom surface 46 and respective sidewalls 45 of via 44.

Figure 2:
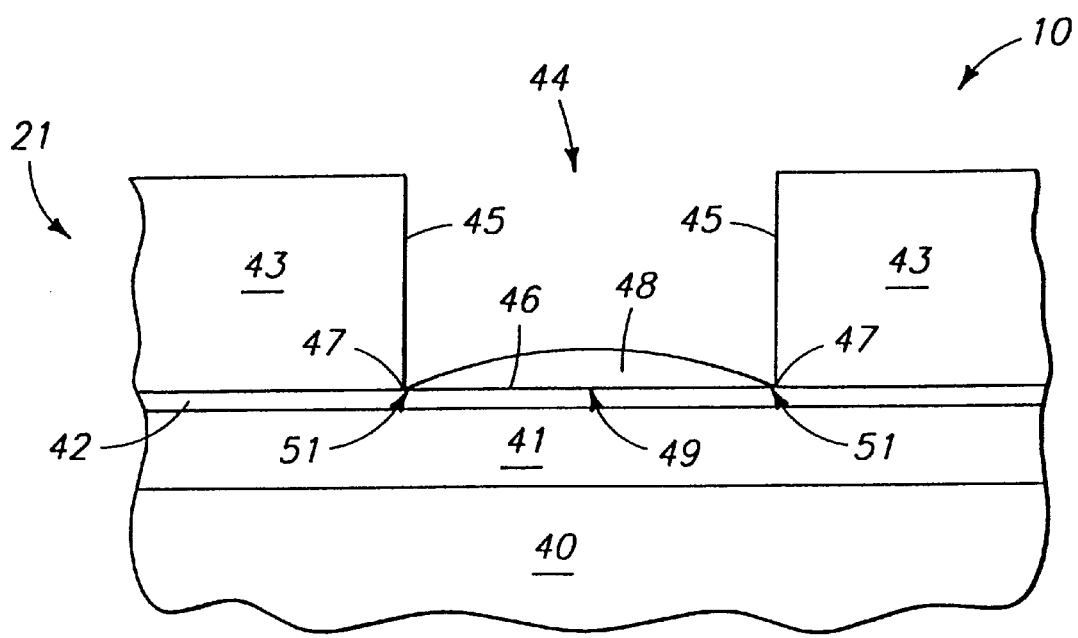
FIG. 2 is a cross-sectional view of a processing step which provides a process layer within the via of the semiconductor device shown in FIG. 1.

Referring to FIG. 2, a process layer 48 is subsequently provided upon semiconductor workpiece 21 following the formation of via 44 within insulative layer 43. In accordance with one embodiment of the present invention, process layer 48 forms a liner, glue layer or barrier layer typically utilized in the formation of advanced interconnect systems. In particular, provision of process layer 48 improves adhesion of a later formed via-filling material or plug, such as tungsten or aluminum or copper within via 44. In other embodiments, plural process layers 48 are formed within semiconductor workpiece 21. For example, provision of a thin Ti layer below a TiN liner may reduce via resistance (only a single layer is shown in FIG. 2).

Process layer 48 typically comprises a metal such as titanium or titanium nitride. Process layer 48 is preferably formed by Ionized Metal Plasma Physical Vapor Deposition (IMP PVD). Such IMP PVD sputtering techniques provide increased bottom coverage of process layer 48 within via 44. In other embodiments, other deposition methods such as conventional sputtering techniques are utilized to deposit process layer 48.

In the case of IMP PVD, a significant percentage of the neutral atoms emitted by the source are ionized by the RF plasma generated between the source and the substrate. These metal ions arrive at the wafer at an incidence normal to the surface 46 due to the presence of a normal electric field. This results in substantial improvement in the bottom coverage of the via 44. As can be expected, the sidewall coverage is significantly reduced. Implementing IMP PVD of TiN can result in acceptable bottom coverage down to 0.1 micron via and contact openings. Further, the sidewall thickness is low, allowing the formation of low resistance, high aspect ratio vias of either aluminum or copper.

Ionized metal plasma (IMP) deposition is a production implementation of ionized magnetron sputtering where Ti atoms are sputtered from a target into a medium density plasma (~$10^{11}$ ion/cm$^3$) where they are thermalized and ionized. The metal ions are then transported across the dark-space sheath at the wafer with high directionality due to the electric field, resulting in high bottom coverage with a dense fine-grained metal film.

Figure 3:
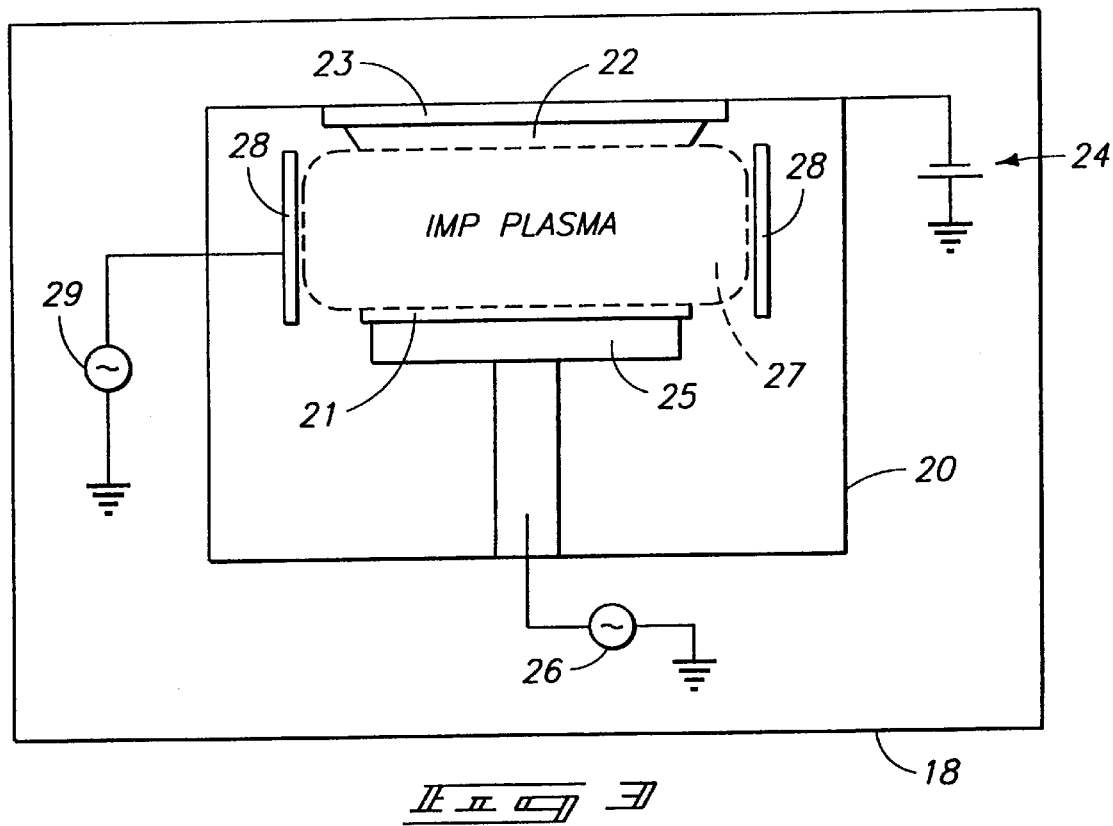
FIG. 3 is an illustrative diagram of a first chamber of a semiconductor workpiece reactor.

Referring to FIG. 3, a schematic diagram of an ionized metal plasma physical vapor deposition (IMP PVD) chamber or first chamber 20 is shown within a reactor 18. According to one processing method of the present invention, chamber 20 is a deposition process module within an Endura HP PVD™ system available from Applied Materials, Inc. of Santa Clara, Calif. A vacuum is provided within first chamber 20 during processing of semiconductor workpiece 21.

A source or target 22 of the desired film material for forming process layer 48 (e.g., Ti or TiN) is provided at the upper portion of the illustrated chamber 20. The target 22 is electrically grounded via coupling with a negative electrode 23 of a DC power source 24. Similar to conventional sputtering techniques, a first process gas is provided within the chamber 20. First process gas preferably comprises an inert gas. For example, Ar is utilized within chamber 20 for Ti deposition and Ar and N$_2$ are both provided within chamber 20 for TiN deposition.

Chamber 20 includes a pedestal or susceptor 25 configured to receive a semiconductor wafer or workpiece 21 to be processed. Susceptor 25 is coupled with a radio frequency (RF) bias source 26 in the illustrated embodiment of the invention. RF bias source 26 generates a 400 kHz signal in one embodiment of the invention although signals of other frequencies may be utilized. In one embodiment (not shown), the RF bias source 26 is omitted.

An IMP plasma 27 is generated within chamber 20 intermediate the target 22 and semiconductor workpiece 21. IMP plasma 27 is preferably a medium density plasma (e.g., ~$10^{11}$ ion/cm$^3$). A coil 28 is provided intermediate the target 22 and semiconductor workpiece 21 as shown in the illustrated embodiment of chamber 20. Coil 28 is preferably a single turn inductive coil.

An RF power source 29 is coupled with coil 28 as shown. RF power from source 29 is provided to the coil 28 at a desired frequency, such as 2 MHz. Coil 28 inductively couples the RF power to the first chamber 20. The provision of RF power assists with the formation of IMP plasma 27 and provides ionization of metal atoms sputtered from the target 22. More specifically, a significant percentage of the neutral atoms sputtered or emitted from the source or target 22 are ionized and thermalized by the RF plasma 27 generated between the target 22 and substrate or semiconductor workpiece 21. Ionized metal plasma physical vapor deposition of TiN results in acceptable bottom coverage down to 0.1 micron via and contact openings and the thickness upon sidewalls 45 is low, thus allowing formation of low resistance, high aspect ratio vias by aluminum or copper.

The main process variables which affect the film properties for ionized metal plasma physical vapor deposition are DC power, RF power, process pressure and the Ar/N$_2$ gas ratio. The DC power (4–8 kW) mainly controls the deposition rate and the RF power (1–3 kW) controls the ionization efficiency.

Since the ionization efficiency depends on the residence time of the source atoms within these IMP plasma 27, a higher gas pressure is preferably utilized. In particular, higher pressures of 20 mTorr–40 mTorr are utilized compared with pressures of 1 mTorr–3 mTorr utilized within conventional physical vapor deposition processes.

Referring again to FIG. 2, the coverage of process layer 48 typically varies in thickness over various portions of bottom surface 46. For example, adequate coverage of a first thickness is typically provided upon a first area or a center region 49 of the bottom surface 46. However, coverage of a second thickness is typically thin upon second areas 51 adjacent the corners 47 of via 44. The second thickness of process layer 48 adjacent corners 47 is typically less than the first thickness of process layer 48 formed at the center region of bottom surface 46. FIG. 2 illustrates such "bread loafing" of process layer 48 which can occur following the utilization of IMP PVD process techniques.

In accordance with methods of the present invention, some of the deposited process layer 48 is distributed to other areas of the semiconductor workpiece 48 following the formation of process layer 48. Preferably, the distribution provides additional process layer material in areas adjacent the corners 47 of via 44. Ideally, deposited process layer material is also distributed upon at least portions of sidewalls 45 of via 44. As described in detail below, sputtering is the preferred method for distributing the formed process layer 48.

Figure 4:
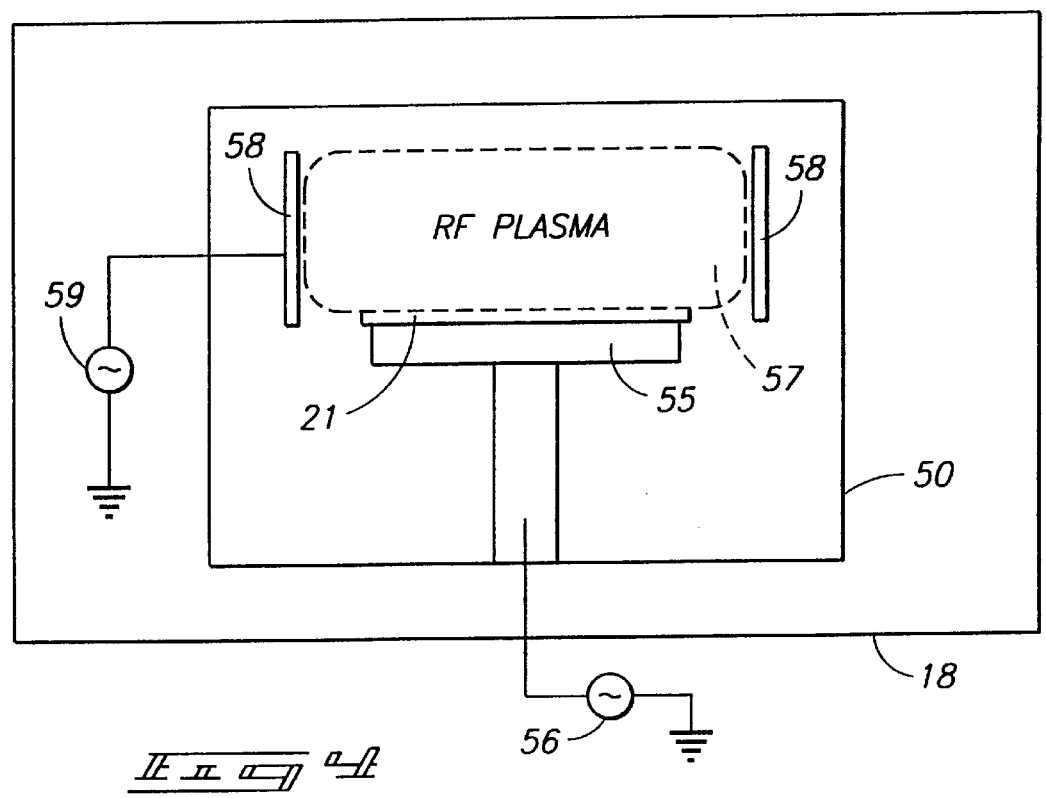
FIG. 4 is an illustrative diagram of a second chamber of the semiconductor workpiece reactor.

Referring to FIG. 4, subsequent processing of semiconductor workpiece 21 following the deposition of process layer 48 is described. More specifically, following the formation of process layer 48 upon the bottom surface 46 of via 44, semiconductor workpiece 21 undergoes further processing apart from the target 22.

In one embodiment, semiconductor workpiece 21 is removed from first chamber 20 of reactor 18 and is placed into a sputter or second chamber 50 of reactor 18. Second chamber 50 comprises a clean chamber in the Endura process system in accordance with one aspect of the present invention. Alternatively, second chamber 50 is provided apart from reactor 18 according to other aspects of the present invention. Ideally, first chamber 20 and second chamber 50 individually provide a vacuum for processing of semiconductor workpiece 21 within the respective chambers. In addition, semiconductor wafer or workpiece 21 is maintained within a vacuum during removal of workpiece 21 from first chamber 20 and insertion into second chamber 50. In other embodiments, target 22 is removed from chamber 20 and semiconductor workpiece 21 is subsequently processed as described below in the same chamber 20.

One embodiment of second chamber 50 within reactor 18 is shown in FIG. 4. Second chamber 50 includes a susceptor 55 and coil 58. A second process gas is provided within second chamber 50. Second process gas preferably comprises an inert gas such as Ar. Semiconductor workpiece 21 is provided upon the susceptor 55 within second chamber 50. Susceptor 55 is preferably electrically coupled with an RF bias source 56. RF bias source 56 is configured to produce a 13.56 MHz biasing signal. However, RF bias signals of other frequencies may be applied to susceptor 55 and semiconductor workpiece 21.

Coil 58 provided within second chamber 50 is preferably a multi-turn inductive coil. Coil 58 is electrically coupled with an RF power source 59. RF power source 59 is configured to generate a 400 kHz RF signal which is applied to coil 58. Coil 58 inductively couples the RF signal to the second chamber 50 providing an RF plasma 57. Following the inductive coupling of the RF signal, ions of the second process gas are created within RF plasma 57. The process gas ions are directed by electric fields generated by RF sources 56, 59 to the semiconductor workpiece 21 and susceptor 55.

Figure 5:
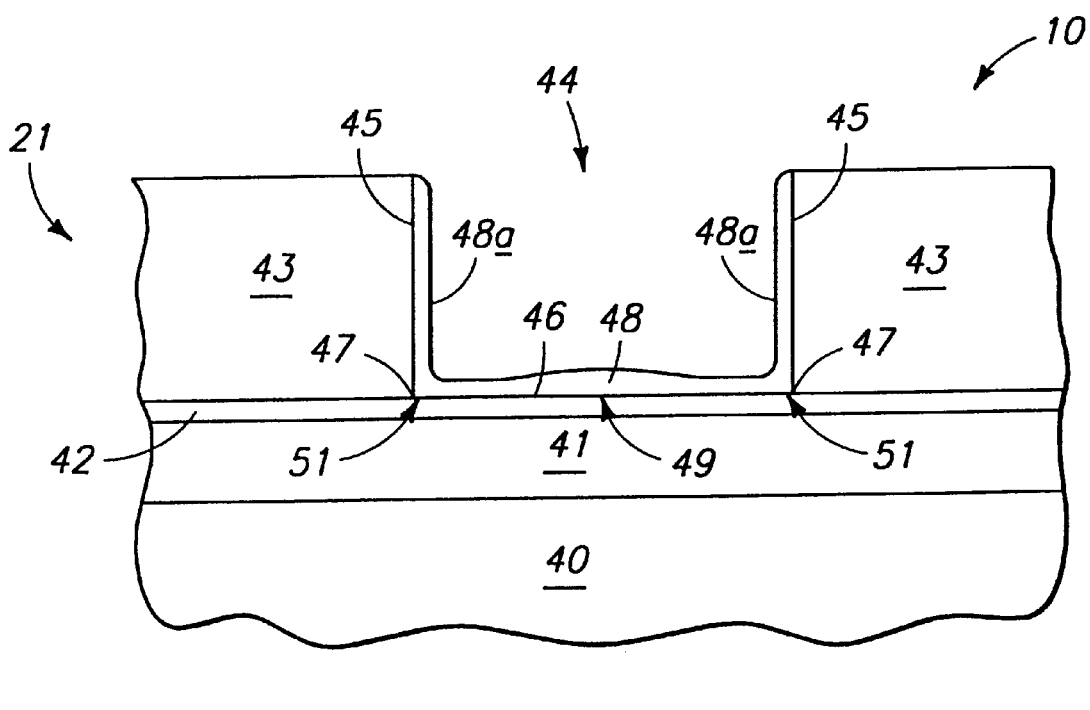
FIG. 5 is a cross-sectional view of a processing step subsequent to the processing step depicted in FIG. 2.

Referring to FIG. 5, directing the process gas ions or "sputtering" ions to the semiconductor workpiece 21 results in sputtering of the process layer 48 formed upon bottom surface 46 of via 44. The sputtering ions strike and distribute at least a portion or some the process layer 48 from the first area 49 within via 44 to the second areas 51 as shown. In particular, at least some or a portion of process layer 48 is sputtered from the center region toward the regions adjacent the corners 47 of via 44. In addition, some of process layer, shown as reference numerals 48*a* in FIG. 5, is sputtered onto the respective sidewalls 45 of via 44. This resputtered layer is dense and provides a barrier layer.

From a comparison of the semiconductor workpiece 21 at a processing step prior to the distribution of process layer 48 (FIG. 2) with the semiconductor workpiece 21 following the distribution of process layer 48 (FIG. 5), it is shown that the sputtering distribution of a portion or some of process layer 48 increases the thickness of the process layer 48 adjacent the corner regions 47 of via 44. In addition, a portion of process layer 48*a* is provided upon respective sidewalls 45. The thickness of process layer 48 at the middle or center region of bottom surface 46 is reduced following the distribution of process layer 48. The formal process layer 46 is generally more uniform following the described distribution processing step.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor device comprising:
   providing a semiconductor workpiece and a target in a process chamber;
   first sputtering a process layer upon a first area of the semiconductor workpiece from the target;
   following the first sputtering, second sputtering at least a portion of the process layer to a second area of the semiconductor workpiece; and
   separating the semiconductor workpiece and the target before the second sputtering including removing the target from the process chamber.

2. The method of forming a semiconductor device according to claim 1 wherein the first sputtering comprises sputtering using ion metal plasma physical vapor deposition.

3. The method of forming a semiconductor device according to claim 1 further comprising forming a via and the process layer is formed within the via.

4. The method of forming a semiconductor device according to claim 1 further comprising forming a via within the semiconductor workpiece, the via comprising a bottom surface, plural sidewalls extending from the bottom surface, and plural corners defined where the sidewalls extend from the bottom surface.

5. The method of forming a semiconductor device according to claim 4 wherein the first and second areas are respectively adjacent a center region of the bottom surface and the corners.

6. The method of forming a semiconductor device according to claim 1 wherein the first sputtering comprises depositing the process layer having a first thickness in the first area and a second thickness in the second area.

7. The method of forming a semiconductor device according to claim 1 wherein the device comprises a sub-quarter micron device.

8. A method of forming a semiconductor device comprising:
   providing a semiconductor workpiece and a target in a process chamber;
   forming a via within the semiconductor workpiece, the via including plural sidewalls joining a bottom surface at respective plural corners;
   providing a process layer upon at least a portion of the bottom surface of the via using the target;
   following the providing of the process layer, distributing at least some of the process layer towards the corners within the via; and
   separating the semiconductor workpiece and the target before the distributing including removing the target from the process chamber.

9. The method of forming a semiconductor device according to claim 8 wherein the providing the process layer comprises sputtering using ion metal plasma physical deposition.

10. The method of forming a semiconductor device according to claim 8 wherein the distributing comprises sputtering.

11. The method of forming a semiconductor device according to claim 8 wherein the device comprises a sub-quarter micron device.

12. A method of forming a semiconductor device comprising:
    providing a semiconductor workpiece and a target in a process chamber;
    first sputtering a process layer upon at least a portion of the semiconductor workpiece from the target;
    removing the target from the process chamber; and
    following the removing, second sputtering at least some of the process layer.

13. The method of forming a semiconductor device according to claim 12 wherein the first sputtering comprises sputtering using ionized metal plasma physical vapor deposition.

14. The method of forming a semiconductor device according to claim 12 further comprising maintaining the semiconductor workpiece within a vacuum during the first sputtering and the second sputtering.

15. The method of forming a semiconductor device according to claim 12 wherein the second sputtering comprises:
    providing radio frequency power;
    ionizing a process gas using the radio frequency power; and
    following the ionizing, sputtering the process layer using the process gas.

16. The method of forming a semiconductor device according to claim 12 further comprising forming a via within the semiconductor workpiece comprising plural sidewalls joining a bottom surface at respective plural corners, wherein the second sputtering provides some of the process layer adjacent the corners and upon at least a portion of the sidewalls.

17. The method of forming a semiconductor device according to claim 12 wherein the first sputtering deposits the process layer having a first thickness upon a first area and a second thickness upon a second area of the semiconductor workpiece and the second sputtering comprises sputtering some of the process layer from the first area to the second area.

18. The method of forming a semiconductor device according to claim 12 further comprising forming a via within the semiconductor workpiece comprising plural sidewalls joining a bottom surface at respective plural corners and the first sputtering comprises sputtering the process layer onto a bottom surface of the via and the second sputtering comprises distributing some of the process layer toward the corners.

19. The method of forming a semiconductor device according to claim 12 wherein the device comprises a sub-quarter micron device.

20. A method of forming a semiconductor device comprising:
   providing a semiconductor workpiece and a target in a process chamber;
   forming a via within the semiconductor workpiece, the via including plural sidewalls joining a bottom surface at respective plural corners;
   first sputtering a process layer upon at least a portion of the bottom surface from the target using ionized metal plasma physical vapor deposition;
   removing the target from the process chamber; and
   following the removing, second sputtering at least some of the process layer towards the corners within the via in the absence of the target.

21. The method of forming a semiconductor device according to claim 20 wherein the first sputtering provides a process layer of a first thickness at a center region of the bottom surface of the via and a second thickness less than the first thickness adjacent the corners.

22. The method of forming a semiconductor device according to claim 20 further comprising maintaining the semiconductor workpiece within a vacuum during the first sputtering and the second sputtering.

23. The method of forming a semiconductor device according to claim 20 wherein the device comprises a sub-quarter micron device.

24. A method of forming a sub-quarter micron semiconductor device within a reactor comprising:
   providing a semiconductor workpiece;
   forming a via within the semiconductor workpiece, the via including plural sidewalls joining a bottom surface at respective plural corners;
   following the forming of the via, providing a target, a first process gas and the semiconductor workpiece within a chamber of the reactor;
   inductively coupling radio frequency power with the first process gas;
   forming a radio frequency plasma;
   sputtering atoms from the target;
   thermalizing the atoms using the radio frequency plasma;
   ionizing the atoms using the radio frequency plasma;
   following the ionizing and thermalizing, directing the atoms toward the semiconductor workpiece;
   applying the atoms to the bottom surface of the iva at a substantially normal incidence;
   forming a process layer comprising the atoms upon at least a portion of the bottom surface;
   following the forming of the process layer, removing the target from the chamber of the reactor;
   providing a second process gas within the chamber;
   inductively coupling radio frequency power with the second process gas;
   forming a radio frequency plasma within the chamber;
   forming sputtering ions using the radio frequency plasma;
   directing the sputtering ions toward the process layer; and
   sputtering the process layer to distribute at least some of the process layer adjacent the corners and upon the sidewalls of the via in the absence of the target.

* * * * *

UNITED STATES PATENT AND TRADEMARK OFFICE
CERTIFICATE OF CORRECTION

PATENT NO : 6,176,983B1
DATED : January 23, 2001
INVENTOR(S) : Subhas Bothra et al.

It is certified that error appears in the above-identified patent and that said Letters Patent are hereby corrected as shown below:

Col. 10, Line 23, please delete "iva" and insert --"via"--.

Signed and Sealed this

Fifteenth Day of May, 2001

NICHOLAS P. GODICI

*Attest:*

*Attesting Officer*  Acting Director of the United States Patent and Trademark Office